United States Patent [19]

Macek et al.

[11] Patent Number: 4,969,259

[45] Date of Patent: Nov. 13, 1990

[54] PIN WITH TUBULAR ELLIPTICAL COMPLIANT PORTION AND METHOD FOR AFFIXING TO MATING RECEPTACLE

[75] Inventors: Joseph S. Macek, Binghamton; James R. Petrozello, Endicott; Reinhold E. Tomek, Endwell, all of N.Y.

[73] Assignee: International Business Machines Corporation, Armonk, N.Y.

[21] Appl. No.: 284,203

[22] Filed: Dec. 14, 1988

[51] Int. Cl.[5] .................... H01R 9/09; H01R 13/428
[52] U.S. Cl. .......................... 29/845; 439/82; 439/733; 439/751
[58] Field of Search .................. 29/845; 439/81, 82, 439/751, 733

[56] References Cited

U.S. PATENT DOCUMENTS

| | | |
|---|---|---|
| 2,877,441 | 3/1959 | Narozny . |
| 3,028,573 | 4/1962 | Stoehr . |
| 3,354,854 | 11/1967 | Kosha .................... 113/119 |
| 3,545,080 | 12/1970 | Evans . |
| 3,783,433 | 1/1974 | Kurtz et al. . |
| 3,880,486 | 4/1975 | Avakian . |
| 3,971,610 | 7/1976 | Buchoff et al. . |
| 4,017,143 | 4/1977 | Knowles . |
| 4,057,315 | 11/1977 | Miller et al. . |
| 4,076,356 | 2/1978 | Tamburro . |
| 4,089,104 | 5/1978 | Barry et al. .................... 29/845 |
| 4,110,904 | 9/1978 | Johnson . |
| 4,131,933 | 12/1978 | Agard et al. .................... 361/415 |
| 4,182,542 | 1/1980 | Mattingly, Jr. . |
| 4,183,610 | 1/1980 | Key .................... 439/733 |
| 4,186,982 | 2/1980 | Cobaugh et al. . |
| 4,265,508 | 5/1981 | Chisholm .................... 439/733 X |
| 4,367,583 | 1/1983 | Baccei .................... 29/747 X |
| 4,381,134 | 4/1983 | Anselmo . |
| 4,475,780 | 10/1984 | Walter et al. . |
| 4,530,551 | 7/1985 | Benasutti . |
| 4,533,204 | 8/1985 | Moynagh, Jr. et al. .......... 439/82 X |
| 4,548,450 | 10/1985 | Reimer et al. . |
| 4,586,778 | 5/1986 | Walter et al. . |
| 4,590,673 | 5/1986 | Dornes et al. .................... 29/747 X |
| 4,701,140 | 10/1987 | Orbanic .................... 439/751 |
| 4,731,701 | 3/1988 | Kuo et al. .................... 361/388 |
| 4,735,575 | 4/1988 | Shaffer .................... 439/82 |
| 4,737,114 | 4/1988 | Yaegashi .................... 439/82 |
| 4,743,081 | 5/1988 | Cobaugh .................... 439/751 |
| 4,752,250 | 6/1988 | Seidler .................... 29/882 X |
| 4,763,408 | 8/1988 | Heisey et al. .................... 29/874 |
| 4,768,980 | 9/1988 | Collier .................... 439/751 |
| 4,780,958 | 11/1988 | Shaffer .................... 29/874 |
| 4,781,602 | 11/1988 | Cobaugh .................... 439/82 |
| 4,793,817 | 12/1988 | Hiesbock .................... 439/82 |
| 4,834,719 | 5/1989 | Arenas . |

OTHER PUBLICATIONS

"Insulated Pin for Printed Circuit Cards with Feed--Through Holes" IBM Tech. Disclosure Bulletin, Aug. 1986, pp. 1228–1229.

"Compliant Serpentine Contact", IBM Tech. Disclosure Bulletin, May 1988, pp. 235–236.

*Primary Examiner*—Carl E. Hall
*Assistant Examiner*—Carl J. Arbes
*Attorney, Agent, or Firm*—Norman R. Bardales

[57] ABSTRACT

A compliant portion of the tubular body of a compliant pin is configured with an elliptical cross section. Preferably, the tubular body is seamless but alternatively may have a seam with the edges of the seam connected together. The configuration is particularly useful for micro-miniature pins. In the preferred method embodiment, on one side of a member to which the pin is to be affixed, the leading end of a blank tubular pin is inserted into the mating receptacle of the member and such that the blank pin provides a protrusion or extension on the opposite side of the member. A compliant section with an elliptical cross section if formed in a predetermined part of the protrusion and thereafter the pin is partially retracted into the receptacle so that the compliant section coacts with the receptacle to affix the pin to the member.

10 Claims, 3 Drawing Sheets

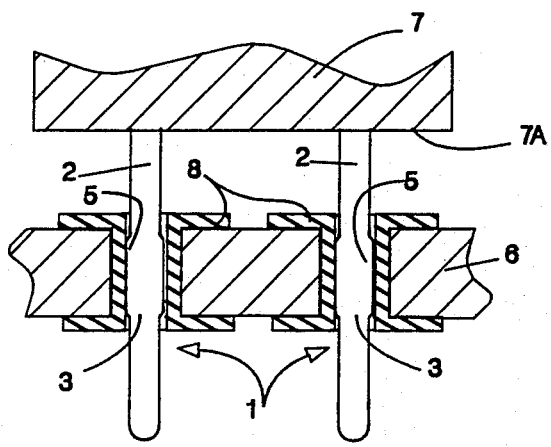
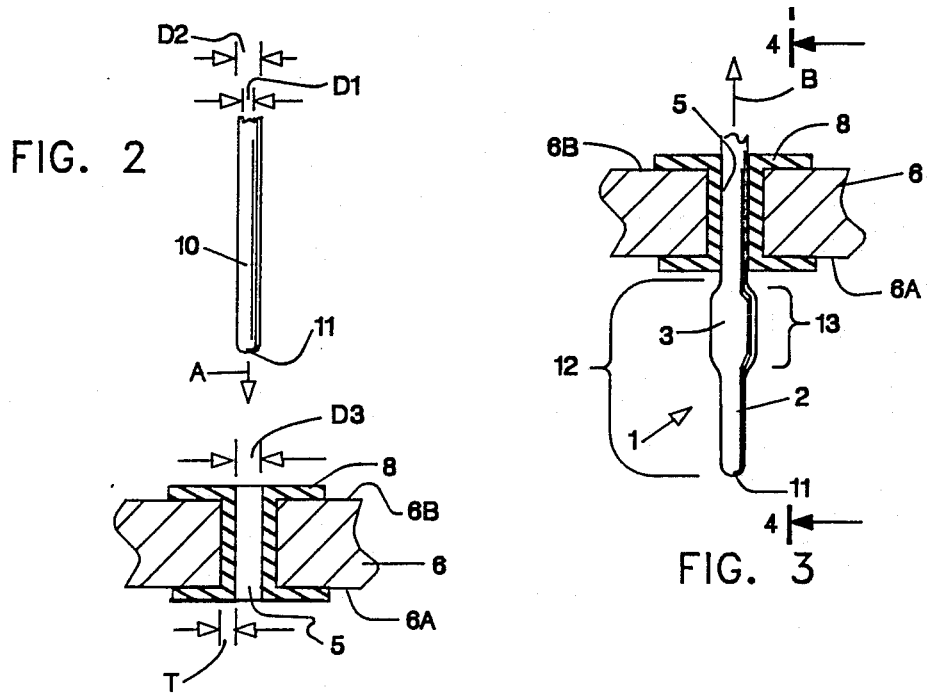

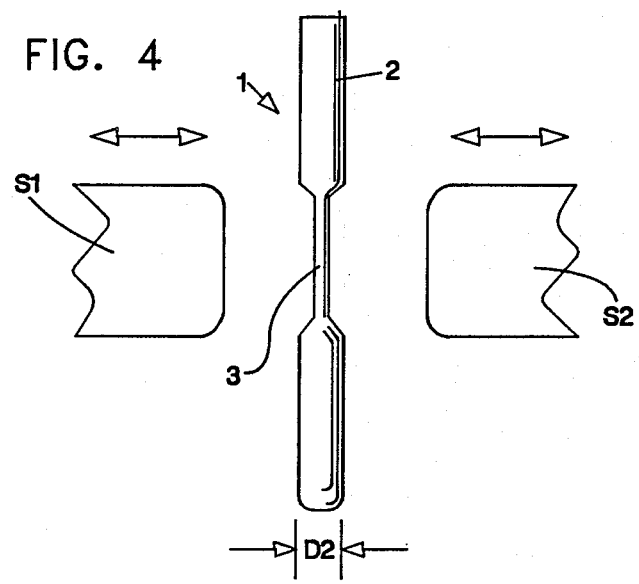
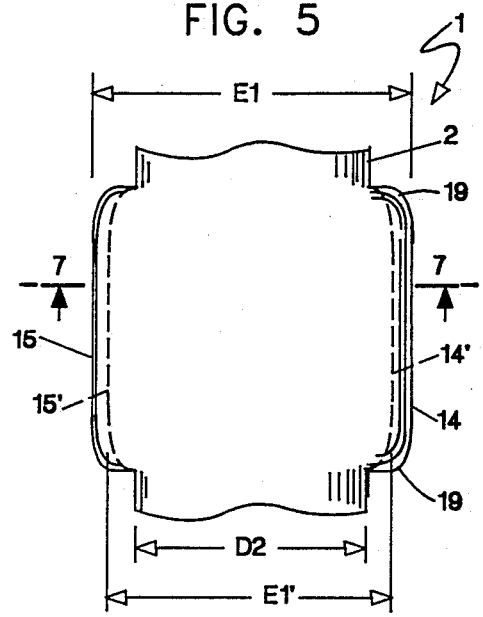
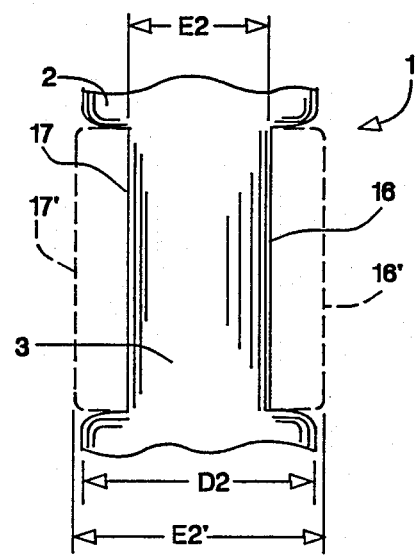

PIN WITH TUBULAR ELLIPTICAL COMPLIANT PORTION AND METHOD FOR AFFIXING TO MATING RECEPTACLE

BACKGROUND OF THE INVENTION

1. Field of the Invention

This invention relates to pins and more particularly to compliant pins for making mechanical and/or electrical connections.

2. Description of the Prior Art

In the prior art, a pin affixed to a member is used for many different types of applications and affixing a pin to a member is done in a variety of ways. In the electronic packaging art, the pin has a mechanical and/or electrical function. U.S. Pat. No. 4,131,933, assigned to the common assignee herein, and U.S. Pat. No. 4,731,701 are examples of such pins used as electrical connectors that are mountable and pluggable, respectively, in the receptacles of printed circuit boards.

One well known way to affix the pin to a member is to provide the member with an opening and to provide the pin with a compliant section with a compatible size such that the section, when inserted into the opening, coacts with the wall or walls of the opening to maintain the pin affixed to the member. The pins are sometimes referred to in these applications and, in particular, in the electronic packaging art simply as compliant pins, and are generally often used therein as electrical connectors or terminals. Compliant pins provide certain advantages over non-compliant types in that they are generally more easy to install/remove and/or rework.

Typical examples, to name just a few, in the electronic packaging art of a pin affixed to an opening in a member and/or methods for affixing the pin to the opening, sometimes referred to in the art as pinning, are as follows:

Non-compliant pin types:
 U.S. Pat. Nos. 2,877,441, 3,028,573, 3,354,854, 4,110,904 4,530,551, 4,548,450 and 4,781,602.

Compliant pin types:
 U.S. Pat. Nos. 3,545,080, 3,783,433, 3,880,486, 3,971,610, 4,017,143, 4,057,315, 4,076,356, 4,381,134, 4,475,780, 4,533,204, 4,586,778, 4,701,140, 4,735,575, 4,737,114, 4,743,081, 4,752,250, 4,763,408, and 4,780,958; and the publications entitled "Insulated Pin For Printed Circuit Cards With Feed-Through Holes" and "Compliant Serpentine Contact", IBM Technical Disclosure Bulletin, Vol. 29, No. 3, August 1986, pp 1228–1229, and Vol. 30, No. 12, May 1988, pp 235–236, respectively.

In the non-compliant pin types, the pin is not readily installed or amenable to removal and/or rework as it requires a head and bulge for sandwiching the member therebetween and thus requires the formation of such members either before or after installation which in turn may require removal of the head or bulge and hence the destruction of the pin during subsequent removal or rework of the pin from the member. Also, the head and bulge radially extend outwardly and overlap the surface of the member surrounding the opening. This limits the use and availability of the overlapped surface area of the member, and in applications where the member is a circuitized substrate such as a printed circuit board, for example, takes up valuable real estate on the substrate. In other non-compliant types, as well as certain compliant types, inserting the pin into the opening subjects the wall of the opening to damage and/or destruction of the wall's integrity due to the configuration of the pin, and/or adverse deformation or destruction of the pin itself. Two examples of such configurations are a pin with an elongated slit or a pin with an open cross-section such as, for example, a C-shape. Furthermore, where the wall of the opening is conductive plating and the pin and the plating form an electrical connection at their interface, the damage and/or destruction of the plating detrimentally affects the reliability of the connection. Moreover, the compliant sections of the prior art because of their configurations and/or their propensity to deform adversely affects the reliability of the gas tight seal desired in the interface or contact point of the section and the plating of the wall of the opening. Moreover, as such, the prior art pins are not amenable for use in high density pin arrays and/or micro-miniature size pins and/or openings.

Thus, in the case of the aforementioned non-compliant pin type references, for example, the tubular terminal pin of U.S. Pat. No. 2,877,441 has two opposed skirts that are formed by two longitudinal elongated slots extending from one end of the pin to an intermediate portion of the pin. A bump-like outward projection is formed on each skirt in the intermediate portion. Located and formed on the pin remote from its aforementioned end and intermediate portion is a ring-like projection, i.e. a bead, which acts as a stop. The pin is affixed to a printed circuit board by inserting the skirts into a hole which penetrates the board. A camming action occurs between the hole wall and the two skirts as the pin is being inserted, i.e. passed through the hole, that causes compression of the two skirts towards each other. The spacing between the bead and the two projections is compatible to the thickness of the board so that when the bead is reached further insertion is prevented and the two projections will have cleared the hole. As a result, the skirts return to their normal outwardly expanded positions causing the pin to be locked to the board between its bead and its two projections.

The probe connector of U.S. Pat. No. 3,028,573 has a spring-like conductive member with a U-shape configuration, the two legs of which are outwardly bowed with respect to each other. Insertion of the probe into the aperture of a printed wiring cross-connecting board compresses the legs towards each other and thus retains the probe in the aperture.

The tubular electric contact pin of U.S. Pat. No. 3,354,854 is retained in the hole of a terminal fitting by staking or embedding an end portion of the pin in the terminal fitting.

In U.S. Pat. No. 4,110,904, a pre-headed terminal pin, with spine-like knuckled ridges formed in the insertion end portion of the pin, is inserted in the aperture of a ceramic type substrate so that the flange forming the head abuts the bottom surface of the substrate. The aperture is recessed at the top surface of the substrate and the insertion end portion upset, i.e. swaged, to form a bulge within the recess of the aperture. As a result, the pin terminal is clamped to the substrate between its bulge and head.

The wiring change pin of U.S. Pat. No. 4,530,551 has two threadably engaged parts One part has an externally threaded end which is inserted through and extends outwardly from a plated thru hole of a printed wiring board. The second part has a hollow internally threaded end section for receiving the aforementioned externally threaded end of the first part. A shoulder on the first part and the enlarged end section of the second part provide retention of the pin in the hole when the two are in threaded engagement.

In the pin and collar arrangement of U.S. Pat. No. 4,548,540, a non-compliant pin is rigidly engaged by the bore of the highly conductive elastomer collar, which in turn fits into a plated through hole of a printed circuit board. The collar has a circular configuration or alternatively has a plurality of longitudinal ridges formed on its outer surface.

In U.S. Pat. No. 4,781,602, a non-compliant pin plugs into a cantilever beam spring socket that is filled with a non-conductive elastomer. The socket is fitted into a plated through hole with sufficient clearance for a solder bond to be effected between the plating of the hole wall and the outer surface of the socket.

Referring now to the aforementioned compliant pin type references, in U.S. Pat. No. 3,545,080, compliant pins are formed with resilient sections out of solid stock or bars with U-shape and split shape cross-section configurations, the latter also referred to in the art as eye-of-the-needle, The resilient section are inserted into the conductive plated aperture of printed circuit board for retention therein.

The respective wedging locking sections of the different electrical contact pins of U.S. Pat. No. 3,783,433, have cross-section configurations of simple C-shape, compound C-shape, V-shape, four-leaf-clover shape and split sections In U.S. Pat. Nos. 3,880,486 and 3,971,610, a resilient elastomer conductor connector element or plug with heads on each of its end is used to retain the element or plug in the hole of a printed circuit board and make contact and electrical connection between the metallized outer surface patterns of the board.

The solderless electrical contact of U.S. Pat. No. 4,017,143 has a C-shaped cross section.

The circuit board pin of U.S. Pat. No. 4,057,315 is solid and has an expanded mounting portions with wedge shaped voids.

The compliant section of the electrical connector of U.S. Pat. No. 4,076,356 has plural pressure ridges formed on its outer surface.

The compliant section of the electrical connector of U.S. Pat. No. 4,381,134 has a C-shaped cross section.

The respective compliant sections of the electrical connectors of U.S. Pat. Nos. 4,475,780 and 4,586,778 have S-shaped cross sections.

In U.S. Pat. No. 4,533,204, the mounting section of an electrical contact is split to form two bowed blade sections, each having a C-shaped cross section.

The compliant portion of the electrical connector of U.S. Pat. No. 4,701,140 has two oppositely disposed C-shaped segments.

The free edges of the spring vanes formed in the compliant mounting section of the contact terminal of U.S. Pat. No. 4,735,575 are made sharp enough to penetrate the plating material of the through hole of a printed circuit board.

In U.S. Pat. No. 4,737,114, the electrical contact pin is split into two legs in the form of an eye-of-the-needle type compliant section.

The compliant section of the connector of U.S. Pat. No. 4,743,081 has a split portion defining two legs. The connector also has a stabilizer section adjacent the compliant section. The stabilizer section or both the stabilizer and compliant section engage the wall of a plated through hole.

The mounting section of the compliant pin of U.S. Patent 4,752,250 is split in two parts, each having a C-shaped cross section.

The compliant section of the connector of U.S. Pat. No. 4,763,408 is formed from solid stock and is split to define two resilient leg members.

In U.S. Pat. No. 4,780,958, a plurality of slits are spaced around the tubular compliant mounting section of a contact terminal, and along one side of each slit are a pair of outward projections to engage the wall of a plated through hole.

Thus, in some of these electronic packaging applications, an electrical conductive compliant pin is affixed by its compliant section in the plated thru hole of a substrate so that the pin extends outwardly from at least one surface of the substrate. The substrate has multilayer circuit patterns and may be a multilayer printed circuit board or a multilayer metallized ceramic substrate. The conductive plated thru hole is connected to one or more of the substrate circuit pattern layers.

In the aforementioned IBM Technical Disclosure Bulletin August 1986 publication, a pin having an enlarged compliant section split in two parts is located in the hole of a printed circuit board and connects the circuits located on the two opposite sides of the board. Also, a non-compliant pin is located in a compression insulator sleeve, which in turn is located in another hole of the board, and is connected to other circuitry.

The serpentine contact of the aforementioned IBM Disclosure Bulletin May 1988 publication is provided with a compliant section tail that has a circular, or C-shaped, cross section that is press fitted into a printed circuit board.

SUMMARY OF THE INVENTION

An object of this invention is to provide a compliant pin which makes a highly reliable mechanical and/or electrical connection.

Another object of this invention is to provide a compliant pin that is simple and/or is simple to affix to a member.

Still another object of this invention is to provide a compliant pin which is not readily adversely deformable and/or is not readily destructible or damageable to itself and/or the member to which it is affixed.

Another object of this invention is to provide an electrical connector compliant pin that provides a highly reliable gas tight seal.

Still another object of this invention is to provide a compliant pin that is amenable for high density pin arrays and/or micro-miniature size pins and/or openings.

According to one aspect of the present invention there is provided compliant pin apparatus which has an elongated tubular member, and the member has a compliant portion that has an elliptical cross section.

According to another aspect of the present invention there is provided a method for affixing a pin to a member which has mating receptacle means for receiving the pin. The receptacle means extends to opposite sides of and through the member The method includes the steps of providing a resilient tubing having a circular cross section, inserting the tubing into the receptacle means from one side of the member and extending a protrusion of the tubing outwardly on the other side of the member from the receptacle means, forming a compliant section with an elliptical cross section configuration in a predetermined portion of the protrusion, pin including said tubing and said compliant section, the tubing and the compliant section defining the pin to be affixed to the member, and thereafter retracting the pin into the receptacle means to engage the compliant section with the receptacle means to affix the pin to the member.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 1 is a schematic front elevation view of a preferred embodiment of the pin apparatus of the present invention;

FIGS. 2 and 3 are schematic partial front elevation views of the pin apparatus of the present invention at different stages of its fabrication in accordance with the preferred method embodiment of the present invention;

FIG. 4 is a side elevation view taken along the line 4—4 of FIG. 3;

FIGS. 5 and 6 are schematic enlarged exaggerated partial front and side elevation views, respectively, of the compliant portion of the pin of FIG. 3 as seen facing FIGS. 3 and 4, respectively;

In the figures, like elements are designated with similar reference numbers.

DESCRIPTION OF THE PREFERRED EMBODIMENT

Figure 7:
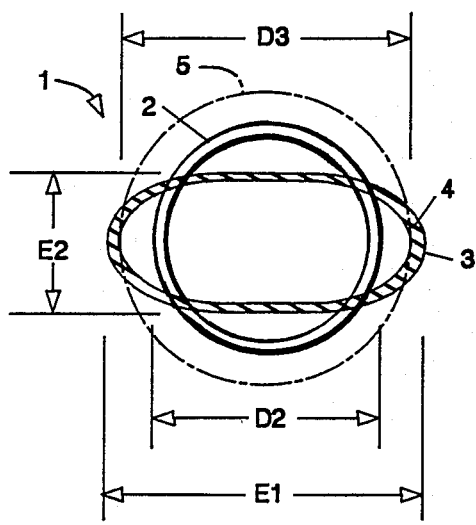
FIGS. 7 and 8 are cross sectional views taken along the line 7—7 of FIG. 5, illustrating the cross-sectional configurations of the compliant portion of FIG. 5 prior to and after, respectively, insertion thereof into the opening of the member of FIG. 3.

Referring to FIG. 1, there is shown the preferred embodiment of the compliant pin apparatus, cf. pins 1. Each pin 1 is an elongated tubular member 2 and has a compliant portion 3 with an elliptical cross section 4, 4′ as shown in greater detail in FIGS. 7 and 8, and described in greater detail hereinafter. The compliant portion 3 of each pin 1 is disposed in an opening or receptacle 5 of a partially shown member 6 which affixes the pin 1 to the member 5. Preferably, the pin 1 is a resilient hollow seamless tubing.

In FIG. 1, pin 1 is part, of a packaging system which uses an array of such pins as the interface between a ceramic module and a printed circuit board or card. By way of example, a packaging system for which the pin 1 of the present invention is particularly suitable is described in the publication "Optimization Of Interconnections Between Packaging Levels", J. H. Kelly et al, IBM J. Res. Develop., Vol. 28, No. 6, November 1984, pp 719 -725. As such, pin 1 is an electrical connector made of a metal conductor, preferably beryllium copper alloy. Other suitable metals are are phosphor bronze alloy, copper, etc. The upper ends of the pins 1 are brazed to input/output pads which are part of the circuit layer, not shown for sake of clarity, on the lower surface 7A of the partially shown pin carrier 7, which is configured as a multilayer circuitized ceramic substrate also referred to in the art as an MLC. For sake of clarity, the circuit layers of substrate 7 are omitted in FIG. 1. Mounted at the upper layer, not shown, of substrate 7 are integrated circuit chips, not shown, which have their input/output terminals bonded to aligned conductor pads of the upper circuit layer of substrate 7, the chips and the substrate 7 being part of a pluggable circuit module. Conductive vias, not shown, in substrate 7 interconnect the circuit layers of the substrate 7. Member 6 is an epoxy-glass printed circuit board having at least one external layer of circuit conductors and at least one internal layer of circuit conductors. For sake of clarity, the circuit conductor conductors and layers of the board 6 have been omitted in the figures. The openings 5 are plated through holes, each having a conductive layer 8, and are interconnected to one or more predetermined circuit layers of the printed circuit board 6. Accordingly, when the pins 1 are plugged into the plated through holes 5, the integrated circuit chips are connected to the circuit layers of the board 6 through the interconnection network of the circuit layers of the substrate 7, pins 1 and plated through holes 5.

The preferred method embodiment for affixing the pin of the present invention to a member having a receptacle for receiving the pin is next discussed with reference to FIGS. 2-8. More particularly, referring to FIG. 2, a resilient elongated tubing 10 is provided and ultimately will become the pin that is to be affixed. The tubing 10 has a rounded point 11 at its lower end and the main body of the tubing 10 is generally cylindrical with a circular cross section with respective inner and outer diameters D1 and D2. Preferably, as aforementioned, the pin to be formed from the tubing 10 is an electrical connector and the member to which it is to be affixed is a printed circuit board similar to the member 6 of FIG. 1 and is designated in FIGS. 2 and 3 with the same reference numbers for sake of simplicity. Tubing 10 is thus an electrically conductor metal and is preferably a beryllium copper alloy. Accordingly, board 6 FIGS. 2 and 3 has an array of a plurality of plated through holes, e.g. plated through hole 5, as the receptacles for receiving a corresponding array of such pins. Likewise, each hole 5 extends through the board 6 between its lower and upper planar surfaces or sides 6A and 6B, respectively, and has a conductive layer 8. The diameter of the hole 5 is designated by the reference character D3 and the thickness T of the plating layer 8 being exaggerated in the Figures for purposes of clarity, with D2 being less than D3. The tubing 10 is axially aligned with the hole 5 for insertion into the plated through hole 5 from the top surface 6B in the direction of the arrow A as shown in FIG. 2. After insertion of tubing 10 into hole 5, tubing 10 has a protrusion 12, cf. FIG. 3, extending outwardly from the hole 5 on the other side 6A of the board 6.

Next, a compliant section 3 with an elliptical cross section configuration 4, cf. FIG. 7, is formed in a portion 13, FIG. 3, of the protrusion 12 by, for example, the schematically shown pair of synchronously operated opposing swagging jaws S1 and S2, cf. FIG. 4. More particularly, the jaws S1 and S2 deform the portion 13 of tubing 10 from its former circular cross section to an elliptical cross section 4 which has a major axis outside diameter with a dimension or size designated by the reference character E1 which is greater than the diameter D3 of the hole 5, and a minor axis diameter of dimension E2 which is less than the circular diameter D2 of the tubing 10. As a result, as shown in FIG. 3, the tubing 10 is now formed as a pin 1 having the aforementioned elongated tubular member 2 and compliant section 3 according to the principles of the present invention. Except for the compliant section 3, which has an elliptical cross section, the rest of the tubular member 2 has a substantially circular cross section. The now so formed pin 1 of FIGS. 3-4 is ready to be and is next affixed to the member 6.

Figure 8:
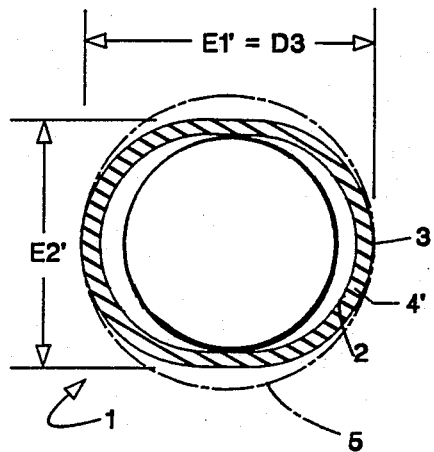

As such, the pin 1 is next retracted back into the hole 5 in the direction indicated by the arrow B in FIG. 3 to engage the compliant section 3 with the wall of the hole 5 and thereby affixing the pin 1 to the member 6, as shown in FIG. 1, as next described in greater detail with reference to FIGS. 5-8. In FIGS. 7 and 8, the circumference of hole 5 is shown in phantom outline for sake of explanation.

Referring now to FIGS. 5 and 7, outside the hole 5, the resilient compliant section 3 is in its unbiased state. For this unbiased state or condition, the position of the parallel longitudinal edges 14 and 15 of the section 3 are shown in FIG. 5 in solid outline form. As is obvious to those familiar with the art, the edges 14 and 15 are coincident with the respective loci of the two vertices of all the elliptical cross sections of the section 3, such as the elliptical cross section 4 taken along the line 7—7 of FIG. 5 and shown in FIG. 7. As is well known, each of the two vertices for each elliptical cross section is defined by and is coincident with a mutually exclusive one of the respective ends of the major, i.e. transverse, axis diameter of the particular elliptical cross section. Similarly, the position of the two parallel longitudinal edges 16 and 17 for the aforementioned unbiased state of section 3 are shown in solid 15 outline form in FIG. 6. The two edges 16 and 17 are coincident with the respective loci of the two ends of the minor or obverse axes of all the elliptical cross sections of the section 3. For the unbiased condition of elliptical section 3, the dimensions of its major and minor axes are E1 and E2, respectively, and E1 is slightly larger than the diameter D3 of the hole 5 and E2 is less than the mentioned.

When the resilient compliant section 3 is drawn into the hole 5, it is transformed to its biased condition or state shown in FIG. 8. More particularly, the edges 14 and 15 are compressed towards each other by the the wall of hole 5, which causes a complimentary expansion of the edges 16 and 17 away from each other. The position of the edges 14 and 15 inside the hole 5 are shown in phantom outline 14' and 15', respectively, in FIG. 5; and the the position of the edges 16 and 17 inside the hole 5 are shown in phantom outline 16' and 17', respectively, in FIG. 6.

As a result of the compression and the resiliency of the section 3, the major axis outside diameter dimension E1' of the elliptical cross section 4', FIG. 8, is substantially equal to the diameter D3 of hole 5, and the minor axis outside diameter of the elliptical cross section 4' of section 3 is substantially increased to the dimension E2' which is larger than the dimension D2 of the tubular member 2. The resilient section 3 in its biased condition provides an interference or other type close fit within the hole 5 and thereby affixes the pin 1 to the member 6. In addition, it provides excellent contact wipe of the plating layer 8 and a highly reliable gas tight bearing between the interface of the plating 8 and the compliant section 3. Moreover, the transition portions, FIG. 5, facilitates insertions and withdrawal of the compliant section 3 into and out of the opening 5.

The present invention is particularly useful for microminiature compliant pin applications and is especially useful for high density connector systems. The pins of the present invention have been found to be substantially non-self destructive or non-destructive to the mating receptacle and hence are highly reliable. One such application using a pin made from beryllium copper tubing had the following parameters:

PIN

Length (overall): 12.7 mm.
Length of Compliant Section: 2.54 mm.
Inside Diameter (D1): 0.260 mm.
Outside Diameter (D2) 0.3874 mm.
Major Axis- Unbiased (E1): 0.4572 mm.
Minor Axis - Unbiased (E2): 0.3048 mm.

Board

Thickness of Board: 5.5 mm.
Diameter of hole (D3): 0.4064 mm.
Thickness of plating (T): 0.0254 mm.

Figure 9:
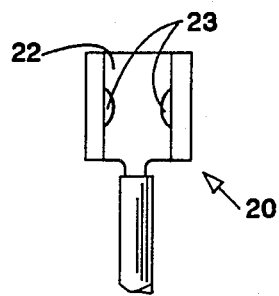
FIG. 9 is a schematic front elevation view of a modification of the pin of FIG. 1.
Figure 10:
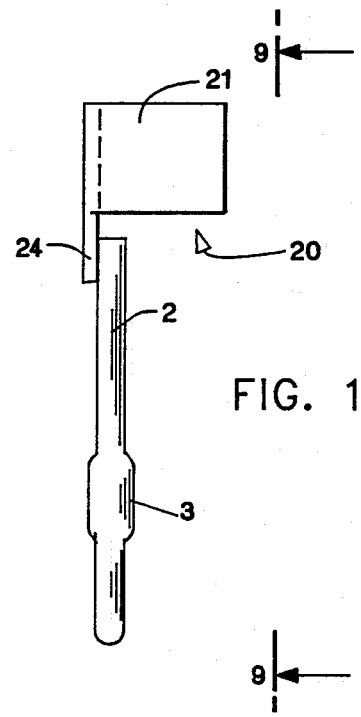
FIG. 10 is a partial side elevation view taken along the line 10—10 of FIG. 9.

Referring now to FIGS. 9 and 10, the other end of the pin 1 thereof is modified to accommodate a bifurcated electrical connector generally indicated by the reference number 20. It has a U-shape configuration with opposing resilient legs 21 and integral center portion 22. On the inwardly facing surfaces of the legs 21 are opposing contact bumps 23 which mate with the edge contact pads, not shown, located on opposite outer surfaces of a printed circuit board. An integral stem 24 depends from the center portion 22 and the upper end of the pin 1 is joined to it by, for example, a solder bond or the like. The connector 20 is readily formed from flat electrically conductive metal stock by, for example, stamping and subsequent shaping. Thus, as an alternative to the flat stem 24, a tubular stem, not shown, may be used that is formed by rolling and which is concentrically mounted outwardly on the upper end of the pin and affixed thereto. The pin 1 is affixed to another member, not shown, such as another printed circuit board, by its elliptical compliant section 3 which fits into a suitable through hole in the case of the last mentioned circuit board. As such, the pin 1 can be used as interconnection system for a card on board electronic packaging system. For an example of such a system, reference should beam to the aforementioned U. S. Pat. No. 4,131,933.

The pins of the present invention are readily amenable to gang processing. For example, in the embodiment of FIGS. 9-10, plural pieces, which are ultimately to become connectors 20, and selvage strip(s) integrally connected to each of the pieces may be stamped out from a common flat stock sheet. The selvage strip(s) remain with the pieces during their subsequent shaping into the connectors 20, and/or during the affixing of the connectors 20 to the tubular pins, and/or the swaging of the pins, and/or the insertion of the pins into the plated through holes of the mother printed circuit board. The selvage strip(s) are later removed as is well known to those skilled in the art. In the embodiment of FIG. 1, it should be noted, that the substrate 7 acts as a carrier for the pins 1 and thus allows the gang processing for affixing them to the member 6. Other alternatives for gang processing the pins is to use a temporary pin carrier or the like.

It should be understood that the invention may be modified in other ways without departing from the principles of the invention. For example, in certain applications, it may be desired to further enhance the connection of the the compliant section 3 to the plating 8 by a solder bonded, and preferably a reflowable solder bond so that the pin and/or the hole can be reworked. Also, the pin 1 is preferably made from seamless tubing but alternatively a tubing with a seam, e.g one formed by rolling flat stock, may also be used in which case the tubing would preferably be joined along the seam by an appropriate bond, e.g. weld, solder, etc.. In forming the section 3, the seam would face one of the swaging jaws S1 and S2. It should be also understood that in the preferred method the elliptical compliant section is formed after the pin is inserted into the opening and then is drawn back into the opening thereby mitigating the possibility of damage and/or deformation of the pin and/or opening. However, as is apparent to those skilled in the art, the compliant section can be formed prior to insertion in the hole. Furthermore, it should also be understood that the pin of of the can be inserted into a shallow opening, i.e. one that does not pass through the member, in which case it would be inserted from its upper end so that the rounded end is remote from the opening. Moreover, while the compliant section is shown as being located at a central portion of the pin, it should be understood that the section can be located closer to the insertion end of the pin to minimize buckling.

Thus, while the invention has been described with reference to preferred embodiments thereof, it will be understood by those skilled in the art that various changes in form and details may be made without departing from the scope of the invention.

We claim:

1. A compliant pin for mounting in the opening of a predetermined member, said pin comprising:
   an elongated tubular member, and
   a portion of said member being compliant, said portion further being resilient and having an elliptical and continuous cross section with major and minor axes, said portion being compressible along said major axis and expandable along said minor axis in a complementary manner by said member when linearly inserted into said opening to provide said mounting at said portion.

2. A compliant pin for mounting in the opening of a predetermined member, said opening having a predetermined cross section configuration of a predetermined width, said pin comprising:
   an elongated tubular member, and
   a portion of said tubular member being compliant and having an elliptical and continuous cross section with respective predetermined major and minor axes outside diameters, at least said portion of said tubular member being resilient, the remainder of said tubular member having a substantially circular cross section with a predetermined outside diameter, said outside diameter of said circular cross section being less than said width of said opening, said major axis diameter being greater than said width of said opening, and said minor axis diameter being less than said diameter of said circular cross section, and said portion being engagable by said predetermined member in said opening when being linearly inserted therein to compress and expand said portion along said major axis and said minor axis diameters, respectively, in a complementary manner to provide said mounting at said portion.

3. A compliant pin for mounting in the opening of a predetermined member, said opening having a predetermined cross section configuration of a predetermined width, said pin comprising:
   an elongated tubular member, and
   a portion of said tubular member being compliant and having an elliptical and continuous cross section with respective predetermined major and minor axes outside diameters, at least said portion of said tubular member being resilient, the remainder of said tubular member having a substantially circular cross section with a predetermined outside diameter, said outside diameter of said circular cross section being less than said width of said opening, said major axis diameter being greater than said width of said opening, and said minor axis diameter being less than said diameter of said circular cross section, and said portion being engagable by said predetermined member in said opening when being inserted therein to compress and expand said portion along said major axis and said minor axis diameters, respectively, in a complementary manner,
   wherein said pin is an electrical connector and said predetermined member is a printed circuit board and said opening is a plated thru hole thereof.

4. A compliant pin according to claim 3, wherein said major axis diameter of said elliptical cross section is compressed substantially to said width of said opening and said minor axis diameter expands no greater than said diameter of said circular section when said compliant section is mounted in said opening.

5. A compliant pin according to claim 4 wherein said tubular member is made of beryllium copper.

6. A compliant pin according to claim 3 wherein said opening has a circular cross section and said width is defined by the diameter of said opening.

7. A compliant pin according to claim 6 wherein said diameter of said opening is substantially 0.4064 mm, said major and minor axis diameters of said elliptical cross section are substantially 0.4572 mm and 0.3048 mm, respectively, and said diameter of said circular cross section of said tubular member is 0.3874 mm.

8. A method of affixing a pin to a member having mating receptacle means for receiving said pin, said member having first and second opposite sides and said receptacle means being extending through said member to said sides, said method comprising the steps of:
   providing a resilient tubing having a circular and continuous cross section,
   inserting said tubing into said receptacle means from one of said sides of said member and extending a protrusion of said tubing outwardly on the other of said sides of said member from said receptacle means,
   forming a compliant section with an elliptical cross section configuration in a predetermined portion of said protrusion, said tubing and said compliant section defining said pin, said elliptical cross section having a major axis and a minor axis, said compliant cross section being compressible along said major axis and expandable along said minor axis in a complementary manner,
   thereafter linear retracting said pin into said receptacle means, and
   engaging said compliant section along said major axis with said receptacle means during said linear retracting, said receptacle means providing by said engaging compression and expansion of said compliant section along said major axis and said minor axis, respectively, in said complementary manner within said receptacle means to provide said affixing thereat of said pin to said member.

9. A method of affixing a pin to a member having mating receptacle means for receiving said pin, said member having first and second opposite sides and said receptacle means being extending through said member to said sides, said method comprising the steps of:
providing a resilient tubing having a circular and continuous cross section,
inserting said tubing into said receptacle means from one of said sides of said member and extending a protrusion of said tubing outwardly on the other of said sides of said member from said receptacle means,
forming a compliant section with an elliptical cross section configuration in a predetermined portion of said protrusion, said tubing and said compliant section defining said pin, said elliptical cross section having a major axis and a minor axis, said compliant cross section being compressible along said major axis and expandable along said minor axis in a complementary manner, thereafter retracting said pin into said receptacle means, and
engaging said compliant section with said receptacle means during said retracting to provide by said engaging compression and expansion of said compliant section along said major axis and said minor axis, respectively, in said complementary manner within said receptacle means to affix thereat said pin to said member, wherein said pin is an electrical connector and said predetermined member is a printed circuit board and said receptacle means is a plated thru hole thereof having a predetermined diameter.

10. The method according to claim 9, wherein said forming of said compliant section provides said elliptical cross section with respective predetermined major and minor axes outside diameters, the remainder of said tubing having a substantially circular cross section with a predetermined outside diameter, said outside diameter of said circular cross section being less than said predetermined diameter of said plated thru hole, said major axis diameter being greater than said diameter of said plated through hole, and said minor axis diameter being less than said diameter of said circular cross of said elliptical cross section being compressed substantially to said diameter of said printed circuit hole and said minor axis diameter expanding no greater than said diameter of said tubing when said compliant section is mounted in said plated through hole.

* * * * *